(12) United States Patent
Nobunaga

(10) Patent No.: US 11,610,616 B2
(45) Date of Patent: Mar. 21, 2023

(54) LOCALLY TIMED SENSING OF MEMORY DEVICE

(71) Applicant: Avalanche Technology, Inc., Fremont, CA (US)

(72) Inventor: Dean K. Nobunaga, Cupertino, CA (US)

(73) Assignee: Avalanche Technology, Inc., Fremont, CA (US)

(*) Notice: Subject to any disclaimer, the term of this patent is extended or adjusted under 35 U.S.C. 154(b) by 393 days.

(21) Appl. No.: 16/900,470

(22) Filed: Jun. 12, 2020

(65) Prior Publication Data

US 2021/0390995 A1 Dec. 16, 2021

(51) Int. Cl.
*G11C 11/00* (2006.01)
*G11C 11/16* (2006.01)

(52) U.S. Cl.
CPC ........ *G11C 11/1673* (2013.01); *G11C 11/161* (2013.01); *G11C 11/1655* (2013.01); *G11C 11/1659* (2013.01); *G11C 11/1693* (2013.01)

(58) Field of Classification Search
None
See application file for complete search history.

(56) References Cited

U.S. PATENT DOCUMENTS

| | | | | |
|---|---|---|---|---|
| 6,044,019 A * | 3/2000 | Cernea | ............. | G11C 11/5621 365/207 |
| 6,490,200 B2 * | 12/2002 | Cernea | ............. | G11C 11/5642 365/207 |
| 8,824,190 B1 | 9/2014 | Kim et al. | | |
| 9,058,852 B2 | 6/2015 | Kim et al. | | |
| 2009/0059672 A1 * | 3/2009 | Kern | ............. | G11C 7/14 327/52 |
| 2010/0097852 A1 | 4/2010 | Chen et al. | | |
| 2010/0265783 A1 * | 10/2010 | Kern | ............. | G11C 7/062 327/52 |
| 2011/0299330 A1 * | 12/2011 | Ong | ............. | G11C 11/1659 365/171 |
| 2014/0104925 A1 | 4/2014 | Azuma et al. | | |
| 2016/0027510 A1 | 1/2016 | Lee et al. | | |
| 2017/0170237 A1 * | 6/2017 | Jung | ............. | H01L 27/2463 |

* cited by examiner

*Primary Examiner* — J. H. Hur
(74) *Attorney, Agent, or Firm* — Bing K. Yen

(57) ABSTRACT

The present invention is directed to a nonvolatile memory device including a plurality of memory cells arranged in rows and columns, a plurality of word lines with each connected to a respective row of the memory cells along a row direction, a plurality of bit lines with each connected to a respective column of the memory cells along a column direction; a column decoder connected to the bit lines; a plurality of sense amplifiers connected to the column decoder; and a plurality of sense amplifier control circuits. Each of the sense amplifiers is connected to a unique one of the sense amplifier control circuits. Each of the sense amplifier control circuits includes a current detector circuit for detecting a sensing current, a current booster circuit for boosting the sensing current, and a timer circuit for providing a delayed trigger for a respective one of the sense amplifiers connected thereto.

16 Claims, 6 Drawing Sheets

LOCALLY TIMED SENSING OF MEMORY DEVICE

BACKGROUND

The present invention relates to a nonvolatile memory, and more particularly, to embodiments of circuitry for the nonvolatile memory and method for using the same.

A resistance-switching memory device normally comprises an array of memory cells, each of which includes a memory element and a selection element, such as access transistor, coupled in series between two electrodes. The selection element functions like a switch to direct current or voltage through the selected memory element coupled thereto. Upon application of an appropriate voltage or current to the selected memory element, the resistance of the memory element would change accordingly, thereby switching the stored logic in the respective memory cell.

FIG. 1 is a schematic circuit diagram of a conventional memory array 20, which comprises a plurality of memory cells 22 arranged in rows and columns with each of the memory cells 22 including an access transistor 24 coupled to a resistance-switching memory element 26; a plurality of parallel word lines 28 with each being coupled to the gates of a respective row of the access transistors 24 in a first direction; a plurality of parallel bit lines 30 with each being coupled to a respective column of the memory elements 26 in a second direction substantially perpendicular to the first direction; and a plurality of parallel source lines 32 with each being coupled to a respective row or column of the access transistors 24 in the first or second direction.

Alternatively, the access transistors 24 of the memory cells 22 may be replaced by two-terminal bidirectional selectors to simplify the wiring configuration and allow stacking of multiple levels of memory arrays. FIG. 2 is a schematic circuit diagram of a memory array 40 incorporating therein two-terminal selectors as selection elements. The memory array 40 comprises a plurality of memory cells 42 arranged in rows and columns with each of the memory cells 42 including a two-terminal bidirectional selector 44 coupled to a resistance-switching memory element 46 in series; a plurality of first conductive lines 48A-48C with each being coupled to a respective row of the memory elements 46 in a first direction; and a plurality of second conductive lines 50A-50C with each being coupled to a respective column of the two-terminal selectors 44 in a second direction substantially perpendicular to the first direction. Accordingly, the memory cells 42 are located at the cross points between the first and second conductive lines 48A-48C and 50A-50C. The first and second conductive lines 48A-48C and 50A-50C may be bit lines and word lines, respectively, or vice versa. Multiple layers of the memory arrays 40 may be stacked on a wafer substrate to form a monolithic three-dimensional memory device.

The resistance-switching memory elements 26 and 46 may be classified into at least one of several known groups based on their resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths or filaments upon application of an appropriate voltage.

The memory element of Magnetic Random Access Memory (MRAM) normally includes a magnetic reference layer and a magnetic free layer with an electron tunnel junction layer interposed therebetween. The magnetic reference layer, the electron tunnel junction layer, and the magnetic free layer collectively form a magnetic tunnel junction (MTJ). Upon the application of an appropriate current to the MTJ, the magnetization direction of the magnetic free layer can be switched between two configurations: parallel (i.e., same direction) and antiparallel (i.e., opposite direction) with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially antiparallel or oriented in opposite directions. The stored logic in the magnetic memory element can be switched by changing the magnetization direction of the magnetic free layer between parallel and antiparallel configurations with respect to the magnetization direction of the reference layer. Therefore, the two stable resistance states enable the MTJ to serve as a nonvolatile memory element.

FIG. 3 is a block diagram illustrating a conventional resistance-switching memory device including circuitry for sensing memory cells. The memory device 60 includes an array of memory cells 62, a row decoder 64 for selecting a word line (WL) and a column decoder 66 for selecting a bit line (BL) for sensing the memory cell coupled to the selected lines, and a sense amplifier module 68 for sensing the resistance state of the selected memory cell. The column decoder 66 includes a plurality of multiplexers (MUXs). The input of each multiplexer is connected to a group of bit lines from the array of memory cells 62, while the output of each multiplexer is connected to a corresponding sense amplifier in the sense amplifier module 68. The sensing operation is controlled by a global control circuit 70, which sends a first command signal "WL_EN" to the row encoder 64 for selecting the word line, a second command signal "YAXBL" to the column decoder 66 for selecting the bit line, and a third command signal "SA_EN" to the sense amplifier module 68 for operating the corresponding sense amplifier.

As memory speed becomes ever faster, the read operation time is shortened, which necessitates the reduction of the signal development time that is needed for a signal to develop on the bit line and have the sense amplifier accurately amplify the signal. The reduction in the signal development time, in turn, would require a corresponding increase in the sensing current to maintain the sensing margin. For some of the resistance-switching memory elements that are switched by current, such as MTJ, a high sensing current may accidentally switch the memory element, a phenomenon commonly known as "read disturb." Therefore, precise control of the sensing current amplitude and the signal development time is critical to prevent read disturb at high read speed. The conventional memory device 60, however, becomes inadequate, especially for MRAM, when the signal development time is reduced to a few nanoseconds because of the inherent variability among the sense amplifiers in the sense amplifier module 68.

For the foregoing reasons, there is a need for a circuit and an operating method therefor that can reliably control the read operation of resistance-switching memory devices at high speed.

SUMMARY

The present invention is directed to a memory device including a control circuit and an operating method therefor that satisfy this need. A nonvolatile memory device having features of the present invention includes a plurality of memory cells arranged in rows and columns; a plurality of word lines with each connected to a respective row of the plurality of memory cells along a row direction; a plurality of bit lines with each connected to a respective column of the plurality of memory cells along a column direction; a column decoder connected to the plurality of bit lines; a plurality of sense amplifiers connected to the column decoder; and a plurality of sense amplifier control circuits. Each of the plurality of sense amplifiers is connected to a unique one of the plurality of sense amplifier control circuits. Each of the plurality of sense amplifier control circuits includes a current detector circuit for detecting a sensing current, a current booster circuit for boosting the sensing current, and a timer circuit for providing a delayed trigger for a respective one of the plurality of sense amplifiers connected thereto. The current detector circuit triggers the current booster circuit to boost the sensing current when the sensing current is detected by the current detector circuit. The timer circuit triggers the respective one of the plurality of sense amplifiers for sensing at end of a delayed time period.

According to another aspect of the present invention, a sensing method for a nonvolatile memory device including the steps of selecting a memory cell for sensing a resistance state thereof by selecting a word line and a bit line connected to the memory cell; detecting a sensing current flowing from the memory cell to the bit line by a current detector circuit, thereby triggering a current booster circuit to increase the sensing current and setting off a timer circuit to initiate a delay time period; and triggering a sense amplifier to compare a bit line voltage and a reference voltage by the timer circuit at end of the delay time period.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Where reference is made herein to a method comprising two or more defined steps, the defined steps can be carried out in any order or simultaneously, except where the context excludes that possibility, and the method can include one or more other steps which are carried out before any of the defined steps, between two of the defined steps, or after all the defined steps, except where the context excludes that possibility.

Figure 4:
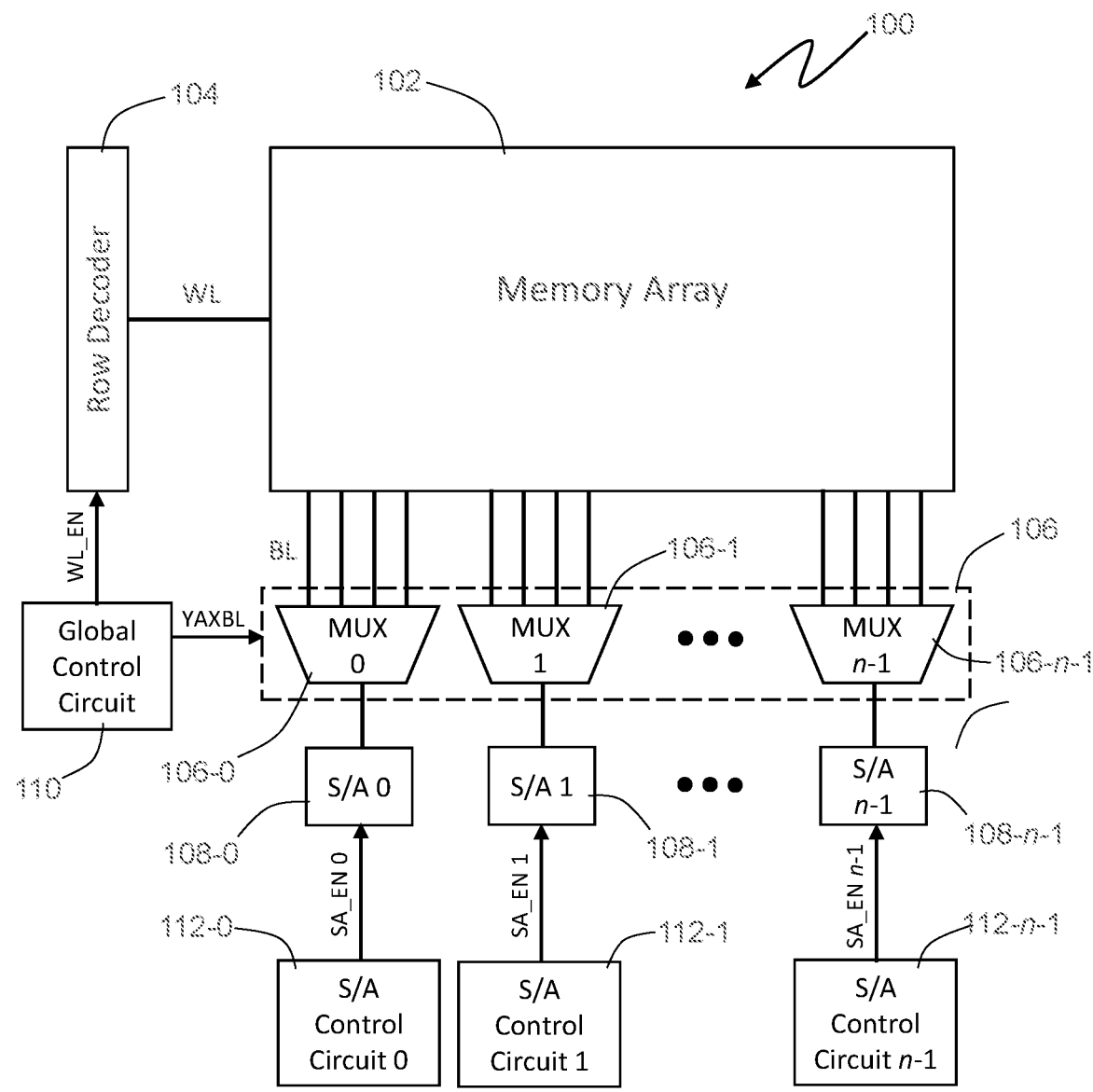
FIG. 4 is block diagram illustrating read circuitry for a nonvolatile memory device in accordance with an embodiment of the present invention.

An embodiment of the present invention as applied to a nonvolatile memory device incorporating high-speed read circuitry will now be described with reference to FIG. 4. Referring now to FIG. 4, the memory device 100 includes an array of memory cells 102, a row decoder 104 for selecting a word line (WL) and a column decoder 106 for selecting a bit line (BL) for sensing the memory cell coupled to the selected lines, a plurality of sense amplifiers 108 for sensing the resistance state of the memory cells, a global control circuit 110 for selecting the word line and bit line for sensing, and a plurality of local sense amplifier (S/A) control circuits 112 with each controlling a corresponding one of the plurality of sense amplifiers 108.

Figure 1:
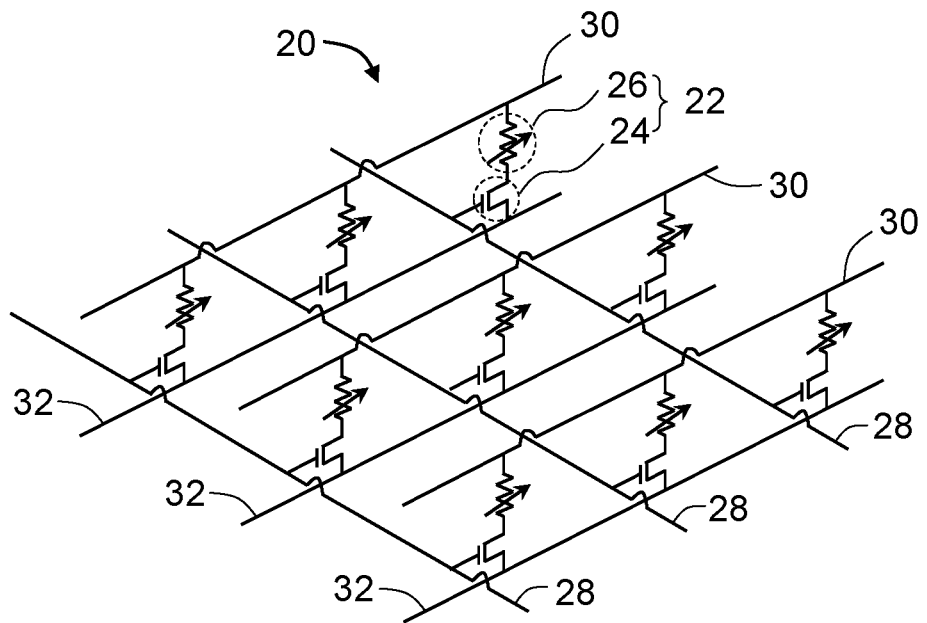
FIG. 1 is a schematic circuit diagram for an array of memory cells with each memory cell including a resistance-switching memory element and an access transistor coupled in series between a bit line and a source line.
Figure 2:
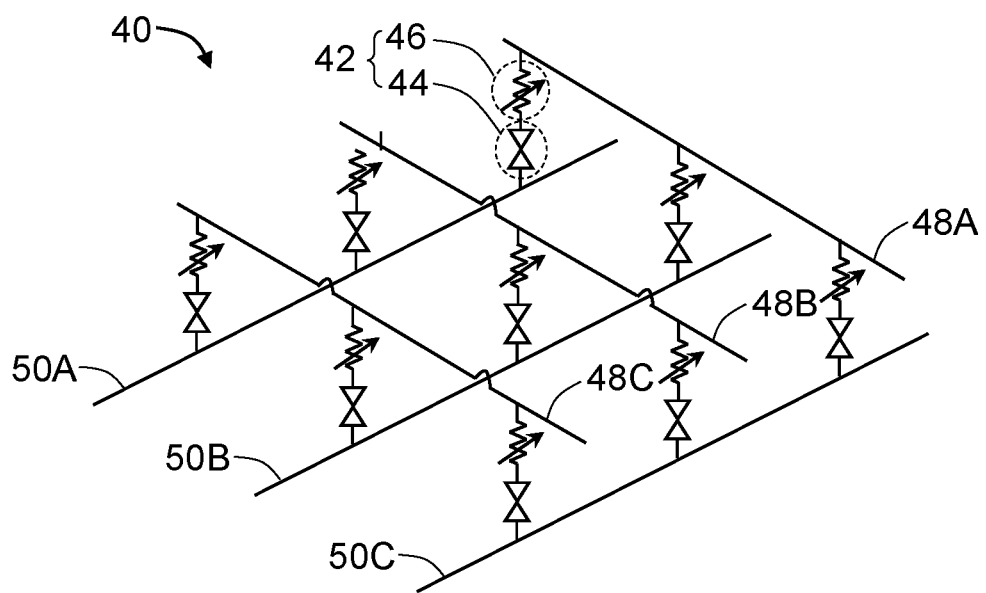
FIG. 2 is a schematic circuit diagram for an array of memory cells with each memory cell including a resistance-switching memory element and a two-terminal selector coupled in series between a word line and a bit line.
Figure 3:
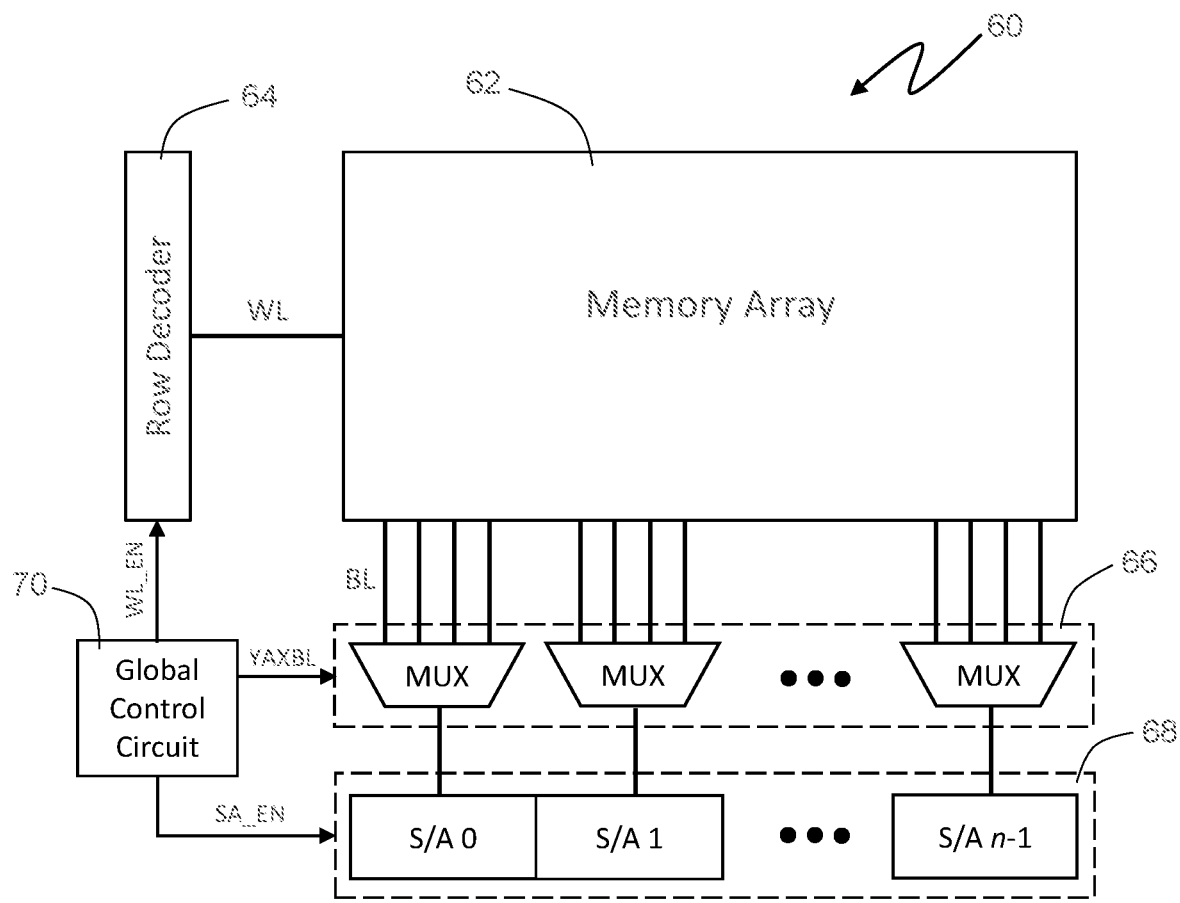
FIG. 3 is a block diagram illustrating read circuitry for a conventional nonvolatile memory device.

The array of memory cells 102 may include a plurality of memory cells arranged in rows and columns with each of the memory cells including an access transistor and a resistance-switching memory element coupled in series between a bit line and a source line as shown in FIG. 1. Alternatively, each memory cell may include a two-terminal bidirectional selector and a resistance switching memory element coupled in series between a word line and bit line as shown in FIG. 2.

The column decoder 106 includes a plurality of multiplexers 106-1 to 106-n-1. The input of each multiplexer is connected to a group of bit lines from the array of memory cells 102, while the output of each multiplexer is connected to a corresponding sense amplifier 108 (i.e., multiplexer 106-0 connected to amplifier 108-0, multiplexer 106-1 connected to amplifier 108-1, and so forth). In a read operation, the global control circuit 110 sends a command signal "WL_EN" to the row decoder 104 for selecting the word line and another command signal "YAXBL" to the column decoder 106 for selecting the bit line for sensing the memory cell coupled to the selected word line and bit line, while one of the local S/A control circuits 112 sends a command signal "SA_EN" to operate the sense amplifier connected to the selected bit line. Each sense amplifier is controlled by a dedicated local S/A control circuit (i.e., amplifier 108-0 controlled by local circuit 112-0, amplifier 108-1 controlled by local circuit 112-1, and so forth) to enable high speed sensing.

Figure 5:
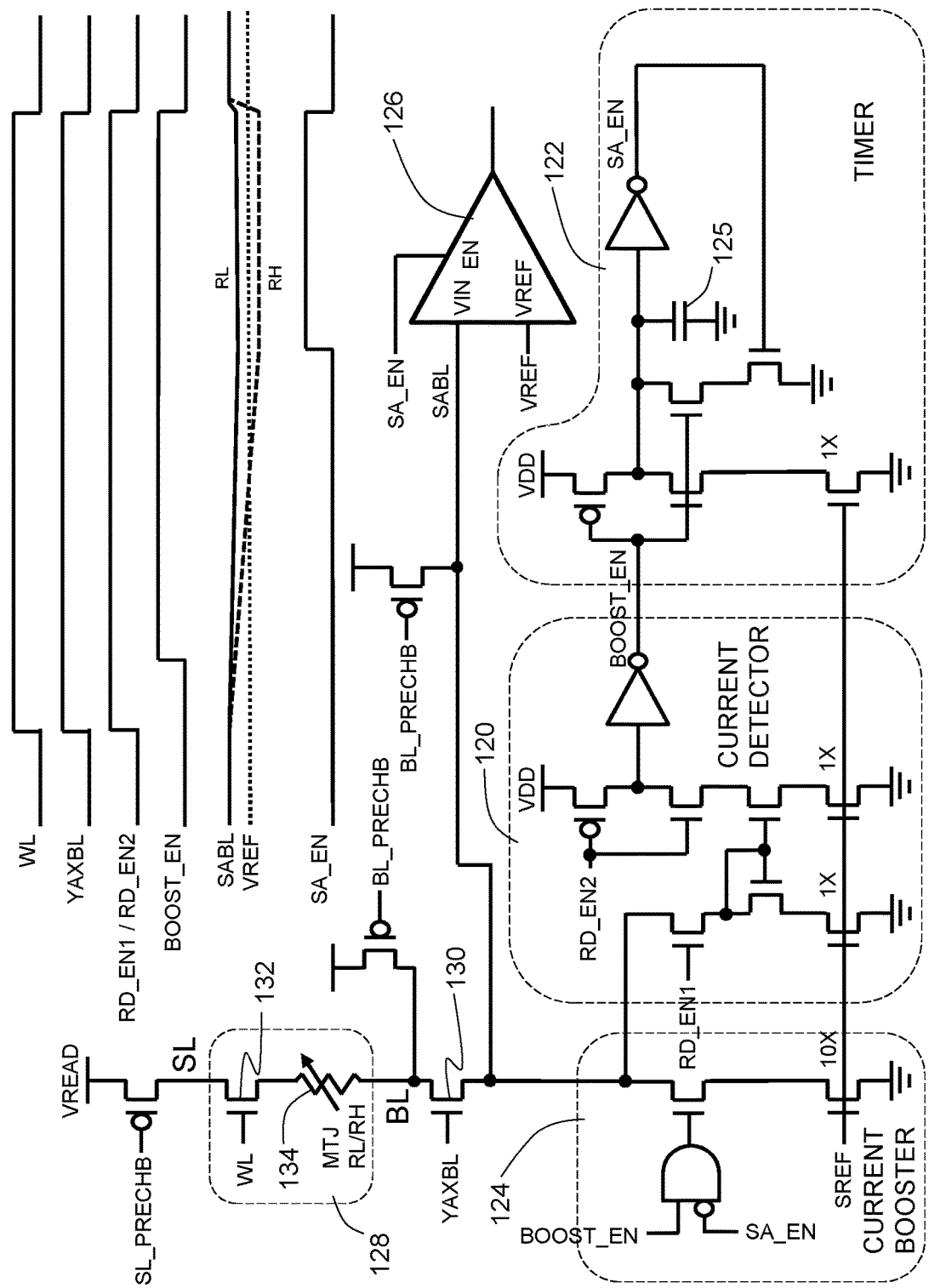
FIG. 5 is a schematic circuit diagram illustrating sensing of a memory cell by a sense amplifier that is controlled by a local sense amplifier control circuit and a timing plot for operating the control circuit in accordance with an embodiment of the present invention.

FIG. 5 is a schematic circuit diagram illustrating an exemplary local S/A control circuit that enables high speed sensing of a memory cell. The local S/A control circuit includes a current detector circuit 120, a timer circuit 122, and a current booster circuit 124. The current detector circuit 120 for detecting the sensing current may utilize a current mirror circuit shown for detecting a sensing current. The current booster circuit 124 for boosting the sensing current may include a plurality of transistors connected in parallel to ground. While the diagram shows 10 transistors (i.e., 10X) connected in parallel as an example, the present invention can accommodate any number of transistors to achieve the desired boost level. The timer circuit 122 provides a delayed trigger for a sense amplifier 126 to accommodate the signal development time period. The timer circuit 122 may include a variable capacitor 125 to modulate the delay time period, which can also be adjusted by using multiple transistors coupled in parallel to boost current instead of a single transistor shown (i.e., 1X).

In addition to being electrically connected to a sense amplifier 126, the local S/A control circuit is electrically connected to a memory cell 128 selected for sensing via a bit line (BL) and a transistor 130 that represents a column decoder. The memory cell 128 may further include an access transistor 132 and a resistance-switching memory element 134 coupled in series between the bit line and source line.

The resistance-switching memory element 134 may change the resistance state thereof by any suitable switching mechanism, such as but not limited to phase change, precipitate bridging, magnetoresistive switching, or any combination thereof. In one embodiment, the memory element 134 comprises a phase change chalcogenide compound, such as but not limited to $Ge_2Sb_2Te_5$ or AgInSbTe, which can switch between a resistive phase and a conductive phase. In another embodiment, the memory element 134 comprises a nominally insulating metal oxide material, such as but not limited to $NiO$, $TiO_2$, or $Sr(Zr)TiO_3$, which can switch to a lower electrical resistance state as metal rich precipitates grow and link to form conductive paths upon application of an appropriate voltage. In still another embodiment, the memory element 134 comprises a magnetic free layer and a magnetic reference layer with an insulating electron tunnel junction layer interposed therebetween, collectively forming a magnetic tunnel junction (MTJ). When a switching current is applied, the magnetic free layer would switch the magnetization direction thereof, thereby changing the electrical resistance of the MTJ. The magnetic free layer may have a variable magnetization direction substantially perpendicular to a layer plane thereof. The magnetic reference layer may have a fixed magnetization direction substantially perpendicular to a layer plane thereof. Alternatively, the magnetization directions of the magnetic free and reference layers may be oriented parallel to the layer planes.

Operation of the local S/A control circuit will now be described with reference to the schematic circuit diagram and the timing plot shown in FIG. 5. The sensing operation begins by turning on the access transistor 132 via the "WL" signal and turning on the transistor 130 via a "YAXBL" signal to select the memory cell 128 for sensing. At about the same time, the bit line is disconnected from a precharged voltage via a signal "BL_PRECHB" and the current detector circuit 120 is turned on via signals "RD_EN1" and "RD_EN2." As the sensing current begins to flow from the source line to the bit line through the memory cell 128, the current detector circuit 120 connected to the bit line detects the sensing current and sends a signal "BOOST_EN" to the timer circuit 122 for turning on the sense amplifier 126 after a delay time period and to the current booster circuit 124 for boosting the sensing current.

With the sensing current being boosted, the bit line voltage "SABL" decreases from the precharged voltage towards one of two terminal or steady state levels corresponding to the low ($R_L$) and high ($R_H$) resistance states of the memory element 134, respectively. When the memory element 134 is in the low resistance state ($R_L$), the voltage drop across the memory cell 128 will be less, resulting in higher bit line voltage. Conversely, when the memory element 134 is in the high resistance state ($R_H$), the voltage drop across the memory cell 128 will be more, resulting in lower bit line voltage.

After expiration of the delay time period, the timer circuit 122 sends a signal "SA_EN" to the current booster circuit 124 for turning off current boosting and to the sense amplifier 126 to commence the operation of comparing the bit line voltage "SABL" to a reference voltage "VREF." At this point, the bit line voltage should have already reached the steady state to enable this comparison by the sense amplifier 126. The reference voltage "VREF" is chosen to be somewhere in between the bit line voltages corresponding to the low and high resistance states, respectively. Accordingly, the memory element 134 will be in the low resistance state if the bit line voltage "SABL" is greater than the reference voltage "VREF." Conversely, the memory element 134 will be in the high resistance state if the bit line voltage "SABL" is less than the reference voltage "VREF."

After the sense amplifier 126 determines the resistance state of the memory element 134 by comparing the bit line and reference voltages, the word line and the bit line are deselected by turning off the transistor 132 ("WL") and the transistor 130 ("YAXBL"), respectively. The current detector circuit 120 is also disabled by switching the "RD_EN1" and "RD_EN2" signals from high to low, which in turn switches the "BOOST_EN" signal from high to low. The low "BOOST_EN" signal to the timer circuit 122 switches the "SA_EN" signal from high to low, which turns off the sense amplifier 126. The bit line may return to the precharged state by switching the "BL_PRECHB" signal from high to low.

It is worth noting that while the current booster circuit 124 includes a plurality of transistors connected in parallel for providing the current boost, different current booster circuits in the memory device may activate different numbers of transistors to attain different levels of boost in operation to accommodate variations among the sense amplifiers 126 and the control circuitry therefor in the memory device owing to design or manufacturing. Likewise, the delay time period associated with the timer circuit 122 may be adjusted for each local S/A control circuit by incorporating a variable capacitor and/or multiple transistors connected in parallel to modulate the current flowing through the timer circuit 122.

Figure 6:
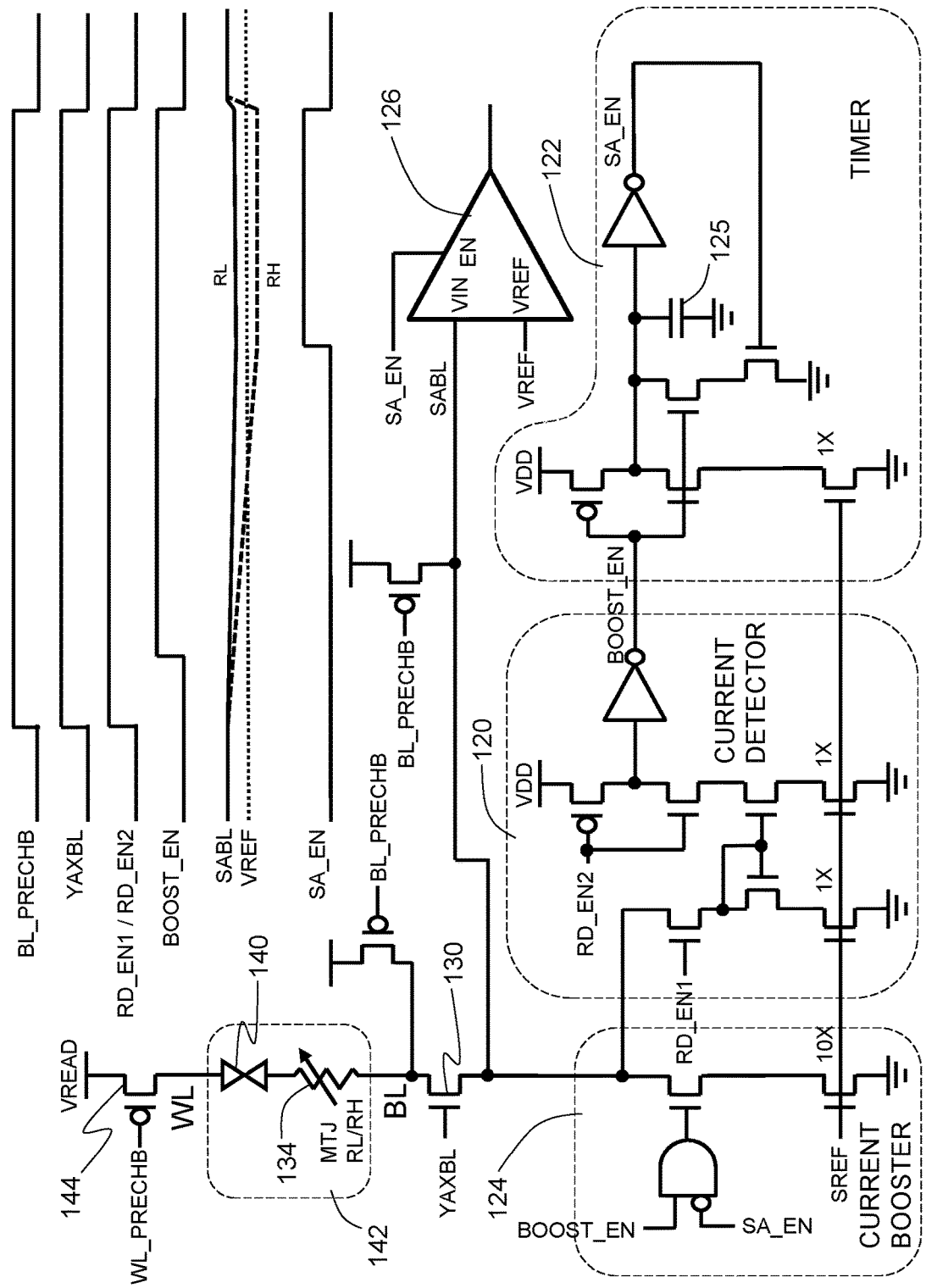
FIG. 6 is a schematic circuit diagram illustrating sensing of another memory cell by a sense amplifier that is controlled by a local sense amplifier control circuit and a timing plot for operating the control circuit in accordance with another embodiment of the present invention.

The access transistor 132 in the memory cell 128 may alternatively be replaced by a two-terminal bidirectional selector 140 as shown in FIG. 6. The sensing operation of the memory cell 142 incorporating the selector 140 is substantially similar to the memory cell 128 shown in FIG. 5 except that the memory cell 142 is selected for sensing by turning on a pull-up transistor 144 by switching the "WL_PRECHB" signal from high to low (not shown).

Figure 7:
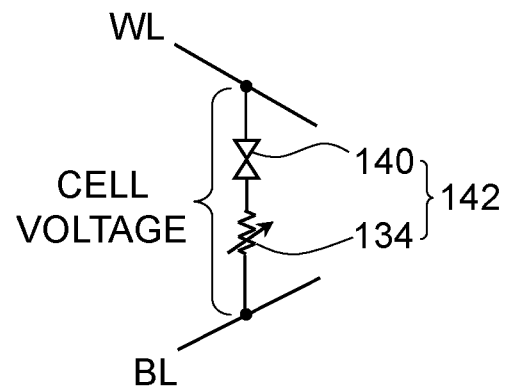
FIG. 7 is an I-V response plot for a nonvolatile memory cell, which includes a memory element and a threshold-switching selector coupled in series, when the memory element is in different resistance states.
Figure 7:
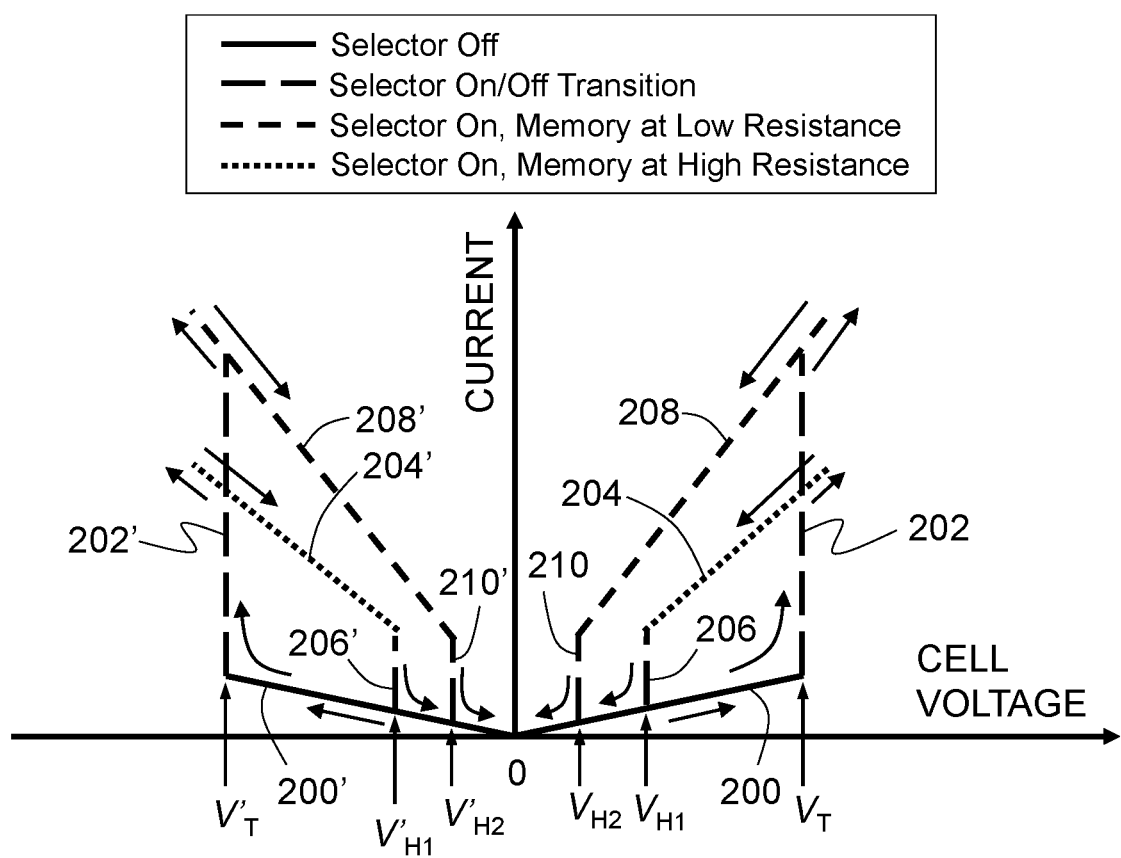

In an embodiment, the two-way bidirectional selector 140 is a threshold switch that exhibits threshold switching behavior as shown in FIG. 7, which is a current-voltage (I-V) response plot for the memory cell 142. As the cell voltage, which is the sum of the selector voltage and the memory element voltage, increases to near a threshold voltage $V_T$, the current slightly increases and the selector 140 remains substantially insulating or in the off-state characterized by a curve 200. At or near the threshold voltage $V_T$, the current rapidly increases as the selector 140 undergoes a transition characterized by a curve 202 from the nominally insulating state (off-state) to the nominally conductive state (on-state).

With continuing reference to FIG. 7, after the selector 140 of the magnetic memory cell 142 is turned on at or near $V_T$, the I-V response will follow a curve 204 with further increase in the cell voltage beyond $V_T$ when the memory element 134 is in the high resistance state without switching. As the cell voltage decreases to near a holding voltage $V_{H1}$, the current decreases following the curve 204 while the selector 140 remains in the on-state (conductive state). At or near the holding voltage $V_{H1}$, the current rapidly decreases as characterized by a curve 206, indicating the transition of the selector 140 from the on-state (conductive state) back to the off-state (insulating state). Further decrease in the cell voltage beyond $V_{H1}$ causes the current to eventually reach zero at about 0 V while the selector 140 remains in the nominally insulating state as depicted by the curve 200. Accordingly, the selector 140 is a volatile threshold switching device that requires the continuing application of a voltage to be conductive.

When the memory element 134 is in the low resistance state, the I-V response of the magnetic memory cell 142 will follow a curve 208 after the selector 140 is turned on at or near $V_T$. With further increase in the cell voltage beyond $V_T$, the selector 140 will remain in the on-state as the current increases. As the cell voltage decreases to near another holding voltage $V_{H2}$, the current decreases following the curve 208 while the selector 140 remains in the nominally conductive state. At or near the holding voltage $V_{H2}$, the current rapidly decreases as characterized by a curve 210, indicating the transition of the selector 140 from the nominally conductive state back to the nominally insulating state. Further decrease in the cell voltage beyond $V_{H2}$ causes the current to eventually reach zero at about 0 V while the selector 140 remains in the nominally insulating state as depicted by the curve 200.

Therefore, the I-V response of the memory cell 142 shown in FIG. 7 is characterized by a hysteresis behavior as the applied cell voltage increases from zero to $V_T$ and decreases back to zero again because of the threshold switching behavior of the selector 140. The hysteresis loop is defined by curves 200, 202, 204, 206, and 200 when the memory element 134 is in the high resistance state. The hysteresis loop is defined by curves 200, 202, 208, 210, and 200 when the memory element 134 is in the low resistance state.

The polarity of the applied voltage to the memory cell 142 may be reversed. When the memory element 134 is in the high resistance state, the I-V response may follow curves 200', 202', 204', 206', and back to curve 200' as the cell voltage increases from 0 V to a point beyond $V'_T$ and back. The insulating-to-conductive transition and the conductive-to-insulating transition occur at or near $V'_T$ and $V'_{H1}$, respectively. When the memory element 134 is in the low resistance state, the I-V response may follow curves 200', 202', 208', 210', and back to curve 200' as the cell voltage increases from 0 V to a point beyond $V'_T$ and back. The insulating-to-conductive transition and the conductive-to-insulating transition occur at or near $V'_T$ and $V'_{H2}$, respectively. Although FIG. 7 shows the I-V response plot of the memory cell 142 being substantially symmetric with respect to the current (vertical) axis, the present invention may be practiced even if the I-V response plot of the memory cell 142 is substantially asymmetric (i.e., $|V_T| \neq |V'_T|$ and/or $|V_{H1}| \neq |V'_{H1}|$ and/or $|V_{H2}| \neq |V'_{H2}|$).

In embodiments where the selector 140 exhibits a threshold switching behavior as shown in FIG. 7, the read voltage $V_{READ}$ applied to the word line should be greater than the threshold voltage $V_T$ of the selector 140, at least initially, to turn on the selector 140. After the selector 140 turns on, $V_{READ}$ can remain constant or decrease to a level above $V_{H1}$ or $V_{H2}$ to maintain the selector 140 on during the sensing operation.

Unlike conventional memory devices that use a global control circuit to control multiple sense amplifiers, the present invention utilizes a dedicated local S/A control circuit to control each sense amplifier, thereby allowing precise control over the signal development time to accommodate variations among circuit components (e.g., transistors, resistors) caused by manufacturing process. Each current booster circuit 124, as shown in FIGS. 5 and 6, may activate a different number of transistors connected in parallel to provide a different level of boost or amplification in the sensing current for meeting the signal development time requirement. Each timer circuit 122 may adjust the delay time period according to the signal development time by varying its capacitance or current. The ability of the present invention to significantly amplify the sensing current and precisely control over the signal development time for each individual sense amplifier and the control circuit therefor enables the usage of a high sensing current to reduce the sensing time required or increase the sensing margin while avoiding read disturb.

The previously described embodiments of the present invention have many advantages, including high sensing speed, large sensing margin, and minimal read disturb. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶6. In particular, the use of "step of" in the claims herein is not intended to invoke the provisions of 35 U.S.C. § 112, ¶6.

What is claimed is:

1. A nonvolatile memory device comprising:
   a plurality of memory cells arranged in rows and columns;
   a plurality of word lines with each connected to a respective row of the plurality of memory cells along a row direction;
   a plurality of bit lines with each connected to a respective column of the plurality of memory cells along a column direction;
   a column decoder connected to the plurality of bit lines;
   a plurality of sense amplifiers connected to the column decoder; and a plurality of sense amplifier control circuits, each of the plurality of sense amplifier control circuits including a current booster circuit and a timer circuit, wherein each of the plurality of sense amplifiers is connected to a unique one of the plurality of sense amplifier control circuits, wherein a sensing current triggers the current booster circuit to increase the sensing current flowing through a respective one of the plurality of memory cells and sets off the timer circuit to trigger a respective one of the plurality of sense amplifiers to compare a bit line voltage and a reference voltage at the end of a delayed time period.

2. The nonvolatile memory device of claim 1, wherein each of the plurality of memory cells includes an access transistor and a magnetic tunnel junction.

3. The nonvolatile memory device of claim 2, wherein the magnetic tunnel junction includes a magnetic free layer having a variable magnetization direction substantially perpendicular to a layer plane thereof, a magnetic reference layer having an invariable magnetization direction substantially perpendicular to a layer plane of the magnetic reference layer, and a tunnel junction layer interposed between the magnetic free layer and the magnetic reference layer.

4. The nonvolatile memory device of claim 1, wherein each of the plurality of memory cells includes a two-terminal bidirectional selector and a magnetic tunnel junction.

5. The nonvolatile memory device of claim 4, wherein a current-voltage response of the each of the plurality of memory cells is characterized by a hysteresis loop.

6. The nonvolatile memory device of claim 1, wherein the plurality of sense amplifier control circuits are configured to enable different levels of amplification in sensing current among different sense amplifier control circuits.

7. The nonvolatile memory device of claim 1, wherein each of the plurality of sense amplifier control circuits further includes a current detector circuit, which is separate from the current booster circuit, for detecting the sensing current.

8. The nonvolatile memory device of claim 7, wherein the current detector circuit includes a current mirror circuit.

9. The nonvolatile memory device of claim 7, wherein the current detector circuit triggers the current booster circuit to boost the sensing current when the sensing current is detected by the current detector circuit.

10. The nonvolatile memory device of claim 1, wherein the current booster circuit includes a plurality of transistors connected in parallel to ground.

11. A sensing method for a nonvolatile memory device comprising the steps of:
selecting a memory cell for sensing a resistance state thereof by selecting a word line and a bit line connected to the memory cell;
detecting a sensing current flowing from the memory cell to the bit line by a current detector circuit, thereby triggering a current booster circuit to increase the sensing current flowing through the memory cell and setting off a timer circuit to initiate a delay time period; and
triggering a sense amplifier to compare a bit line voltage and a reference voltage by the timer circuit at the end of the delay time period.

12. The method of claim 11 further comprising the step of deactivating the current booster circuit by the timer circuit at the end of the delay time period.

13. The method of claim 11, wherein the memory cell includes an access transistor and a magnetic tunnel junction.

14. The method of claim 11, wherein the memory cell includes a two-terminal bidirectional selector and a magnetic tunnel junction connected in series between the word line and the bit line.

15. The method of claim 11, wherein the current detector circuit is separate from the current booster circuit and includes a current mirror circuit.

16. The method of claim 11, wherein the current booster circuit includes a plurality of transistors connected in parallel to ground.

* * * * *